United States Patent
Kawamura et al.

(10) Patent No.: US 10,068,629 B2
(45) Date of Patent: *Sep. 4, 2018

(54) FERROELECTRIC MEMORY CELL SENSING

(71) Applicant: Micron Technology, Inc., Boise, ID (US)

(72) Inventors: Christopher John Kawamura, Boise, ID (US); Scott James Derner, Boise, ID (US)

(73) Assignee: MICRON TECHNOLOGY, INC, Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/690,873

(22) Filed: Aug. 30, 2017

(65) Prior Publication Data

US 2017/0365321 A1    Dec. 21, 2017

Related U.S. Application Data

(63) Continuation of application No. 15/073,989, filed on Mar. 18, 2016, now Pat. No. 9,792,973.

(51) Int. Cl.
*G11C 11/22*    (2006.01)

(52) U.S. Cl.
CPC ........ *G11C 11/2273* (2013.01); *G11C 11/221* (2013.01); *G11C 11/2275* (2013.01)

(58) Field of Classification Search
CPC ............ G11C 11/2273; G11C 11/2275; G11C 11/221; G11C 11/5657; G11C 14/0027; G11C 14/0072
See application file for complete search history.

(56) References Cited

U.S. PATENT DOCUMENTS

| | | | |
|---|---|---|---|
| 5,262,982 A | | 11/1993 | Brassington et al. |
| 5,703,804 A | * | 12/1997 | Takata .................. G11C 5/143 365/145 |
| 6,333,870 B1 | | 12/2001 | Kang |

(Continued)

OTHER PUBLICATIONS

ISA/EPO, International Search Report and Written Opinion of the International Searching Authority, Int'l. Appl. No. PCT/US2017022678, dated Jun. 13, 2017, Korean Intellectual Property Office, Seo-gu, Daejeon, Republic of Korea, 9 pgs.

(Continued)

*Primary Examiner* — Khamdan Alrobaie
(74) *Attorney, Agent, or Firm* — Holland & Hart LLP

(57) ABSTRACT

Methods, systems, and devices for operating a ferroelectric memory cell or cells are described. A memory device may maintain a digit line voltage at a ground reference for a duration associated with biasing a ferroelectric capacitor of a memory cell. For example, a digit line that is in electronic communication with a ferroelectric capacitor may be virtually grounded while a voltage is applied to a plate of the ferroelectric capacitor, and the ferroelectric capacitor may be isolated from the virtual ground after a threshold associated with applying the voltage to the plate is reached. A switching component (e.g., a transistor) that is in electronic communication with the digit line and virtual ground may be activated to virtually ground the digit line and deactivated to isolate the digit line from virtual ground.

20 Claims, 8 Drawing Sheets

(56) References Cited

U.S. PATENT DOCUMENTS

| | | | |
|---|---|---|---|
| 6,438,020 | B1 | 8/2002 | Yamada |
| 6,529,398 | B1 | 3/2003 | Nair et al. |
| 6,549,448 | B2 | 4/2003 | Kang |
| 6,611,448 | B2 | 8/2003 | Nair et al. |
| 7,206,240 | B2 | 4/2007 | Gallo et al. |
| 7,855,923 | B2 | 12/2010 | Li et al. |
| 8,300,446 | B2 | 10/2012 | Qidwai |
| 8,570,812 | B2 | 10/2013 | Madan |
| 9,117,535 | B2 | 8/2015 | Madan et al. |
| 9,401,196 | B1 | 7/2016 | Juvekar et al. |
| 9,613,676 | B1 * | 4/2017 | Wang ............... G11C 11/2275 |
| 2002/0080664 | A1 * | 6/2002 | Takashima ............ G11C 7/12 |
| | | | 365/200 |
| 2002/0188893 | A1 * | 12/2002 | Ogiwara ............... G11C 8/08 |
| | | | 714/42 |
| 2006/0146589 | A1 * | 7/2006 | Karlsson ............. G11C 11/22 |
| | | | 365/145 |
| 2010/0025747 | A1 | 2/2010 | Fukada |
| 2011/0305061 | A1 * | 12/2011 | Evans, Jr. ........... G11C 11/22 |
| | | | 365/145 |
| 2016/0343422 | A1 * | 11/2016 | Marotta ........... G11C 11/2273 |

OTHER PUBLICATIONS

Kawashima, et al., "Bitline GND Sensing Technique for Low-Voltage Operation FeRAM", IEEE Journal of Solid-State Circuits, May 2002, 592-598, vol. 37, No. 5, IEEE.

* cited by examiner

FERROELECTRIC MEMORY CELL SENSING

CROSS REFERENCE

The present application for patent is a continuation of U.S. patent application Ser. No. 15/073,989 by Kawamura et al., entitled "Ferroelectric Memory Cell Sensing," filed Mar. 18, 2016, now U.S. Pat. No. 9,792,973, issued Oct. 17, 2017, assigned to the assignee hereof, and is expressly incorporated by reference in its entirety herein.

BACKGROUND

The following relates generally to memory devices and more specifically to increasing a sensing scheme for a ferroelectric memory cell.

Memory devices are widely used to store information in various electronic devices such as computers, wireless communication devices, cameras, digital displays, and the like. Information is stored by programming different states of a memory device. For example, binary devices have two states, often denoted by a logic "1" or a logic "0." In other systems, more than two states may be stored. To access the stored information, the electronic device may read, or sense, the stored state in the memory device. To store information, the electronic device may write, or program, the state in the memory device.

Various types of memory devices exist, including random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, and others. Memory devices may be volatile or non-volatile. Non-volatile memory (e.g., flash memory) can store data for extended periods of time even in the absence of an external power source. Volatile memory devices (e.g., DRAM) may lose their stored state over time unless they are periodically refreshed by an external power source. A binary memory device may be an example of a volatile memory device and may store a logic state by charging or discharging a capacitor. A charged capacitor, however, may become discharged over time through leakage currents, resulting in the loss of the stored information. Certain features of volatile memory may offer performance advantages, such as faster read or write speeds, while features of non-volatile memory, such as the ability to store data without periodic refreshing, may be advantageous.

FeRAM may use similar device architectures as volatile memory but may have non-volatile properties due to the use of a ferroelectric capacitor as a storage device. FeRAM devices may thus have improved performance compared to other non-volatile and volatile memory devices. In order to determine a logic state stored by a ferroelectric memory cell, a cell plate of the ferroelectric memory cell may be biased to some voltage. Biasing the cell plate, however, may result in undesired behavior in neighboring circuit locations—e.g., a parasitic voltage may be induced on a digit line—due to parasitic elements or material properties within the memory device.

BRIEF DESCRIPTION OF THE DRAWINGS

The disclosure herein refers to and includes the following figures.

DETAILED DESCRIPTION

Figure 1:
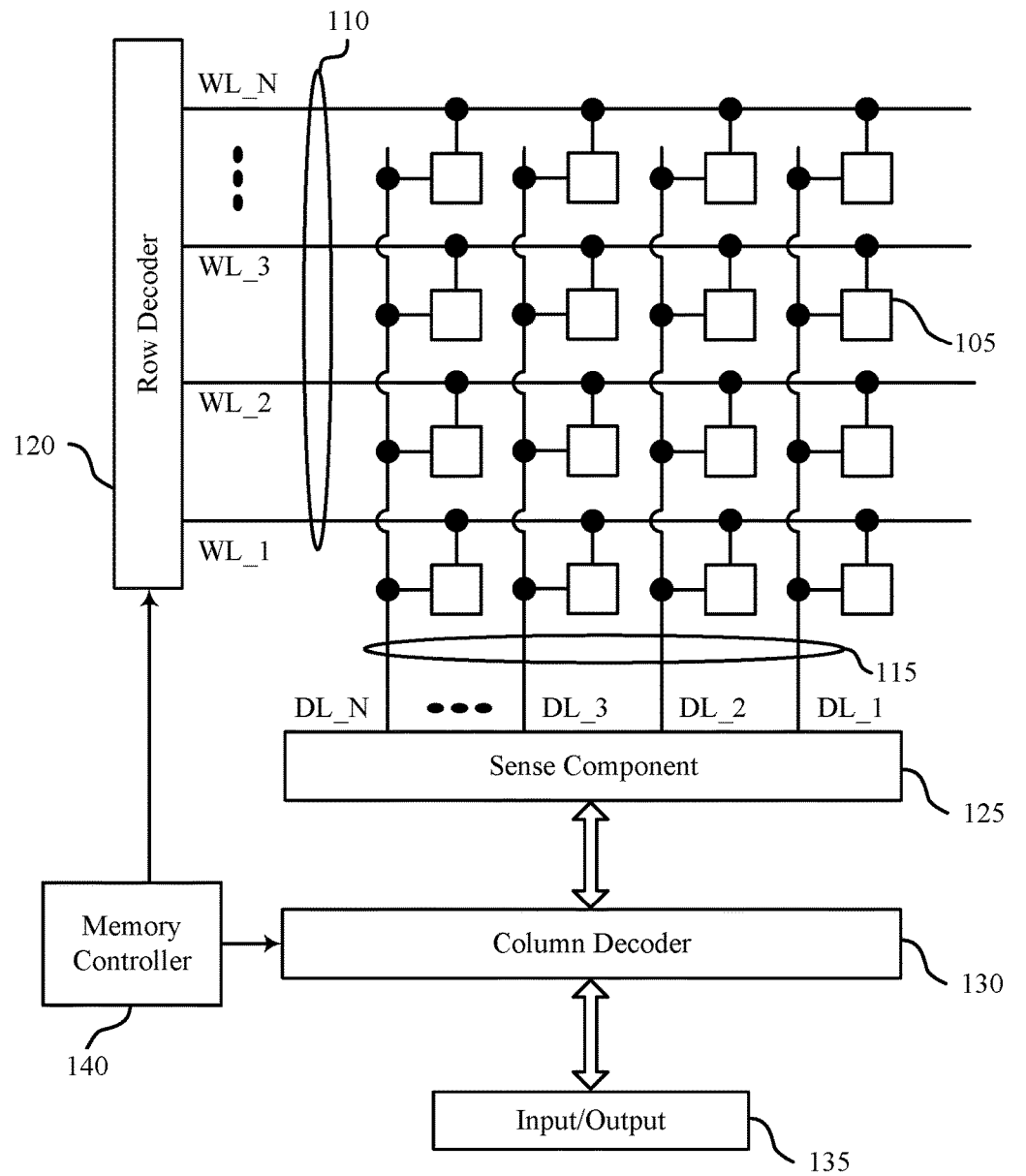
FIG. 1 illustrates an example memory array that supports a sensing scheme for a ferroelectric memory cell in accordance with various embodiments of the present disclosure.

A memory device may maintain a voltage of a digit line at a ground reference (e.g., virtual ground) for a duration associated with biasing a cell plate of a ferroelectric capacitor to combat parasitic effects, such as an induced voltage on the digit line. In one example, a switching component may be activated to connect a digit line that is in electronic communication with a ferroelectric memory cell to virtual ground. Subsequently, a read voltage may be applied to a plate of a ferroelectric capacitor of the ferroelectric memory cell to bias the ferroelectric capacitor. The applied read voltage may generate parasitic effects throughout the memory device—e.g., a voltage may be induced voltage on a digit line. The induced voltage on the digit line may reduce the amount of charge that is transferred or "dumped" onto the digit line from the ferroelectric capacitor during a read operation and, in turn, may decrease the resulting digit line voltage. So the switching component may be maintained in an active mode to continue the digit line's connection to the ground reference while the read voltage is applied.

By maintaining the connection to the ground reference, the induced parasitic voltage on the digit line may be dampened or driven back to the ground reference during and after "moving" the plate voltage (i.e., after biasing the plate). During or following the application of the read voltage, the ferroelectric memory device may deactivate the switching component, isolating the digit line from the ground reference. The ferroelectric memory cell may then be selected for a read operation by activating a selection component of the ferroelectric memory cell, and the ferroelectric capacitor may discharge on to the digit line.

The voltage of the digit line that results from discharging the capacitor may be based on the logic state that is stored by the ferroelectric capacitor and the initial voltage of the digit line. For instance, the voltage of the digit line resulting from a stored logic state "1" may be greater than the voltage of the digit line resulting from a stored logic state "0." In this way, the effects of parasitic elements may be reduced and the sensing window—i.e., the difference between the voltage resulting from a logic "1" and a logic "0"—may be increased for a read operation. In some cases, the increased sensing window may also be referred to as a "full dump" window because it allows all or most of the charge stored on the ferroelectric capacitor to be transferred to the digit line and subsequently read, which, in turn, provides for a more accurate determination of the logic state of the memory cell.

Features of the disclosure introduced above are further described below in the context of a memory array. Specific examples are then described with reference to a circuit that supports a sensing scheme for a ferroelectric memory cell. These and other features of the disclosure are further illustrated by and described with reference to apparatus diagrams, system diagrams, and flowcharts that relate to a sensing scheme for a ferroelectric memory cell.

FIG. 1 illustrates an example memory array 100 that supports a sensing scheme for a ferroelectric memory cell in accordance with various embodiments of the present disclosure. Memory array 100 may also be referred to as an electronic memory apparatus. Memory array 100 includes memory cells 105 that are programmable to store different states. Each memory cell 105 may be programmable to store two states, denoted as a logic "0" and a logic "1." In some cases, memory cell 105 is configured to store more than two logic states. A memory cell 105 may include a capacitor to store a charge representative of the programmable states; for example, a charged and uncharged capacitor may represent two logic states, respectively. DRAM architectures may commonly use such a design, and the capacitor employed may include a dielectric material with linear electric polarization properties. By contrast, a ferroelectric memory cell may include a capacitor that has a ferroelectric as the dielectric material. Different levels of charge of a ferroelectric capacitor may represent different logic states. Ferroelectric materials have non-linear polarization properties; some details and advantages of a ferroelectric memory cell 105 are discussed below.

Operations such as reading and writing may be performed on memory cells 105 by activating or selecting the appropriate access line 110, which may also be referred to as a word line 110, and digit line 115 from WL_1 to WL_N and DL_1 to DL_N, respectively. Activating or selecting a word line 110 or a digit line 115 may include applying a voltage to the respective line. In some cases, a digit line 115 may be referred to as a bit line. Word lines 110 and digit lines 115 are made of conductive materials. For example, word lines 110 and digit lines 115 may be made of metals, such as copper, aluminum, gold, tungsten, or the like. According to the example of FIG. 1, each row of memory cells 105 are connected to a single word line 110, and each column of memory cells 105 are connected to a single digit line 115. By activating (e.g., applying a voltage to) one of the word lines 110 and one of the digit lines 115, a single memory cell 105 may be accessed at their intersection. The intersection of a word line 110 and digit line 115 may be referred to as an address of a memory cell.

In some architectures, the logic-storing device of a cell (e.g., a capacitor) may be electrically isolated from the digit line by a selection component. The word line 110 may be connected to and may control the selection component. For example, the selection component may be a transistor and the word line 110 may be connected to the gate of the transistor. Activating the word line 110 results in an electrical connection or closed circuit between the capacitor of a memory cell 105 and its corresponding digit line 115. The digit line may then be accessed to either read or write the memory cell 105. Accessing memory cells 105 may be controlled through a row decoder 120 and a column decoder 130. In some examples, a row decoder 120 receives a row address from the memory controller 140 and activates the appropriate word line 110 based on the received row address. Similarly, a column decoder 130 receives a column address from the memory controller 140 and activates the appropriate digit line 115. Thus, by activating a word line 110 and a digit line 115, memory cell 105 may be accessed. For example, the memory array 100 may access memory cell 105 by activating DL_1 and WL_3.

Upon accessing, memory cell 105 may be read, or sensed, by sense component 125. For example, sense component 125 may compare a signal (e.g., a voltage) of the relevant digit line 115 to a reference signal in order to determine the stored state of the memory cell 105. If digit line 115 has a higher voltage than the reference voltage, then sense component 125 may determine that the stored state in memory cell 105 was a logic "1" and vice versa. Sense component 125 may include various transistors or amplifiers in order to detect and amplify a difference in the signals, which may be referred to as latching. The detected logic state of memory cell 105 may then be output through column decoder 130 as output 135. With respect to a memory cell 105 that includes a ferroelectric capacitor, reading the memory cell may include biasing—e.g., applying a voltage to—a plate of the ferroelectric capacitor.

The applied biasing voltage may drive the ferroelectric capacitor to release charge on to digit line 115, and so may produce a voltage on digit line 115. The magnitude of the produced voltage may be based at least in part on the logic state that is stored by the ferroelectric capacitor. In some cases, the applied biasing voltage effects components in other locations of memory array 100 (e.g., a nearby digit line 115). These effects may be due to parasitic elements that are inherent to memory array 100, and some examples may include parasitic capacitance, parasitic inductance, and the like. These parasitic elements may be associated with the physical layout of memory array 100 (e.g., trace widths, trace locations, trace lengths, etc.) and signal properties of the applied voltage (e.g., signal frequency, rate of voltage change, step size, etc.).

In one example of parasitic effects, the ferroelectric capacitor of memory cell 105 is biased by applying a read voltage to a plate of the ferroelectric capacitor. Concurrently with applying the read voltage, a voltage may be induced on a corresponding digit line 115 due to the parasitic elements. When the memory cell 105 is selected via the relevant word line 110, the ferroelectric capacitor may share the stored charge with the corresponding digit line 115. The induced voltage may, however, effectively decrease the voltage across the ferroelectric capacitor that results from the biasing and, in turn, the amount of charge released by the ferroelectric capacitor on to the digit line 115, reducing the resulting change in voltage. That is, the ferroelectric capacitor may fail to release the full amount of stored charge to the digit line 115. By failing to fully utilize the stored charge, the difference in the voltages that result from a logic "0" and a logic "1" may also decrease, along with the sensing window.

Therefore, the memory array 100 may maintain a digit line 115 voltage at or near a ground reference during all or a portion of the time that a read voltage in order to combat parasitic effects that result from the applied read voltage and this mitigate sense margin loss. In some examples, the memory array 100 may include a switching component (e.g., a transistor) that is in electronic communication with a digit line 115 and a ground reference (e.g., virtual ground) to reduce the induced parasitic voltage. Memory array 100 may use control signals to activate and deactivate the switching component.

A memory cell 105 may be set, or written, by activating the relevant word line 110 and digit line 115. As discussed above, activating a word line 110 electrically connects the corresponding row of memory cells 105 to their respective digit lines 115. By controlling the relevant digit line 115 while the word line 110 is activated, a memory cell 105 may be written—i.e., a logic value may be stored in the memory cell 105. Column decoder 130 may accept data, for example input 135, to be written to the memory cells 105. In the case of a ferroelectric capacitor, a memory cell 105 is written by applying a voltage across the ferroelectric capacitor. This process is discussed in more detail below.

In some memory architectures, accessing the memory cell 105 may degrade or destroy the stored logic state and re-write or refresh operations may be performed to return the original logic state to memory cell 105. In DRAM, for example, the capacitor may be partially or completely discharged during a sense operation, corrupting the stored logic state. So the logic state may be re-written after a sense operation. Additionally, activating a single word line 110 may result in the discharge of all memory cells in the row; thus, several or all memory cells 105 in the row may need to be re-written.

Some memory architectures, including DRAM, may lose their stored state over time unless they are periodically refreshed by an external power source. For example, a charged capacitor may become discharged over time through leakage currents, resulting in the loss of the stored information. The refresh rate of these so-called volatile memory devices may be relatively high—e.g., tens of refresh operations per second for DRAM—which may result in significant power consumption. With increasingly larger memory arrays, increased power consumption may inhibit the deployment or operation of memory arrays (e.g., power supplies, heat generation, material limits, etc.), especially for mobile devices that rely on a finite power source, such as a battery. Ferroelectric memory cells may, however, have beneficial properties that may result in improved performance relative to other memory architectures. For example, because ferroelectric memory cells tend to be less susceptible to degradation of stored charge, a memory array 100 that employs ferroelectric memory cells 105 may require fewer or no refresh operations, and may thus require less power to operate.

The memory controller 140 may control the operation (e.g., read, write, re-write, refresh, etc.) of memory cells 105 through the various components, for example, row decoder 120, column decoder 130, and sense component 125. Memory controller 140 may generate row and column address signals in order to activate the desired word line 110 and digit line 115. Memory controller 140 may also generate and control various voltage potentials used during the operation of memory array 100. In general, the amplitude, shape, or duration of an applied voltage discussed herein may be adjusted or varied and may be different for the various operations for operating memory array 100. Furthermore, one, multiple, or all memory cells 105 within memory array 100 may be accessed simultaneously; for example, multiple or all cells of memory array 100 may be accessed simultaneously during a reset operation in which all memory cells 105, or a group of memory cells 105, are set to a single logic state.

In some examples, the memory controller 140 may provide an input to an amplification device that is used to apply a read voltage to the plate of a ferroelectric capacitor in a memory cell 105. In other examples, the memory controller 140 may provide an input to an amplification device used to select a memory cell. The memory controller 140 may also be used to implement feature of the sensing scheme. For instance, the memory controller 140 may provide an input to an amplification device used to activate and deactivate a switching component that is in electronic communication with a digit line and virtual ground. The memory controller 140 may also determine a timing associated with applying a voltage to a plate of a ferroelectric capacitor and isolating the digit line from virtual ground by deactivating the switching component.

Figure 2:
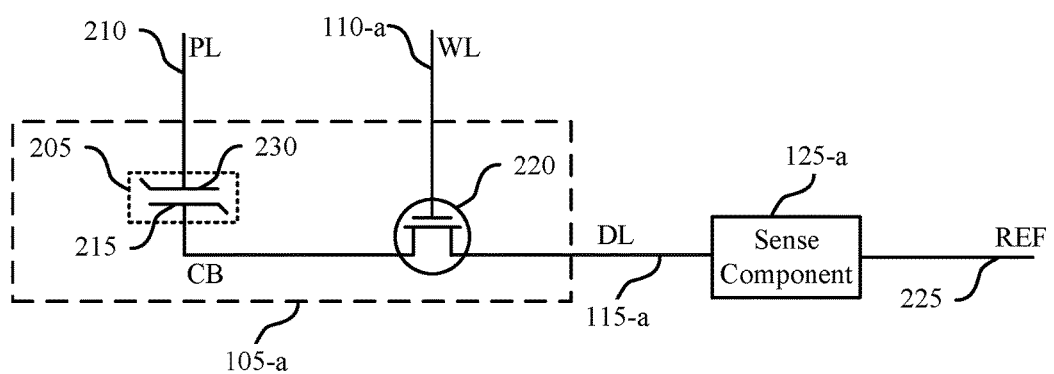
FIG. 2 illustrates an example circuit that supports a sensing scheme for a ferroelectric memory cell in accordance with various embodiments of the present disclosure.

FIG. 2 illustrates an example circuit 200 that supports a sensing scheme for a ferroelectric memory cell in accordance with various embodiments of the present disclosure. Circuit 200 includes a ferroelectric memory cell 105-a, word line 110-a (which may also be referred to as access line 110-a), digit line 115-a, and sense component 125-a, which may be examples of a memory cell 105, word line 110, digit line 115, and sense component 125, respectively, as described with reference to FIG. 1. Memory cell 105-a may include a logic storage component, such as capacitor 205, which has a first plate and a second plate that are capacitively coupled, the first plate may be referred to as cell plate 230 and the second plate may be referred to as cell bottom 215. In some examples, the orientation of the capacitor may be flipped without changing the operation of memory cell 105-a, that is, the first plate may correspond to cell bottom 215 and the second plate may correspond to cell plate 230. In the example of FIG. 2, cell plate 230 may be accessed via plate line 210 and cell bottom 215 may be accessed via digit line 115-a. Also in the example of FIG. 2, the terminals of capacitor 205 are separated by a ferroelectric material. As described above, various states may be stored by charging or discharging capacitor 205, i.e., polarizing the ferroelectric material of capacitor 205. The total charge needed to polarize capacitor 205 may be referred to as the remnant polarization (PR) value, and a voltage of capacitor 205 at which half the total charge of capacitor 205 is reached may be referred to as the coercive voltage (VC).

The stored state of capacitor 205 can be read or sensed by operating various elements represented in circuit 200. Capacitor 205 may be in electronic communication with digit line 115-a. For example, capacitor 205 can be isolated from the digit line 115-a when selection component 220 is deactivated, and capacitor 205 can be connected to digit line 115-a when selection component 220 is activated to select the ferroelectric memory cell 105-a. In other words, ferroelectric memory cell 105-a may be selected using selection component 220 that is in electronic communication with ferroelectric capacitor 205, where ferroelectric memory cell 105-a includes selection component 220 and ferroelectric capacitor 205. In some cases, selection component 220 is a transistor and its operation is controlled by applying a voltage to the transistor gate, where the voltage magnitude is greater than the threshold magnitude of the transistor. Word line 110-a may activate selection component 220; for example, a voltage applied to word line 110-a is applied to the transistor gate, connecting capacitor 205 with digit line 115-a. In an alternative embodiment the positions of selection component 220 and capacitor 205 may be switched, such that selection component 220 is between plate line 210 and cell plate 230 and such that capacitor 205 is between digit line 115-a and the other terminal of selection component 220. In this embodiment, selection component 220 may remain in electronic communication digit line 115-a through capacitor 205. This configuration may be associated with alternative timing and biasing for read and write operations.

Due to the ferroelectric material between the plates of capacitor 205, and as discussed in more detail below, capacitor 205 may not discharge upon connection to digit line 115-*a*. In one scheme, to sense the state that is stored by ferroelectric capacitor 205 during a read, plate line 210 and word line 110-*a* may be biased by an external voltage. In some cases, digit line 115-*a* is isolated from a virtually ground prior to applying the external voltage to plate line 210 and word line 110-*a*. Selecting ferroelectric memory cell 105-*a* may result in a voltage difference (e.g., plate line 210 voltage minus digit line 115-*a* voltage) across capacitor 205. The applied voltage difference may yield a change in the stored charge on capacitor 205, which may depend on the initial state of capacitor 205—e.g., whether the initial state stored a logic "1" or a logic "0"—and may induce a voltage on digit line 115-*a* based on the resulting charge stored on capacitor 205. The induced voltage on digit line 115-*a* may then be compared to a reference (e.g., a voltage of reference line 225) by sense component 125-*a* in order to determine the stored logic state in memory cell 105-*a*.

The specific sensing scheme or process may take many forms. In one example, digit line 115-*a* may have an intrinsic capacitance and develop a non-zero voltage as capacitor 205 charges or discharges in response to the voltage applied to plate line 210. The intrinsic capacitance may depend on physical characteristics, including the dimensions, of digit line 115-*a*. Digit line 115-*a* may connect many memory cells 105 so digit line 115-*a* may have a length that results in a non-negligible capacitance (e.g., on the order of pico farads (pF)). The subsequent voltage of digit line 115-*a* may depend on the initial logic state of capacitor 205, and sense component 125-*a* may compare this voltage to a voltage on reference line 225 provided by a reference component. Other sensing processes that take advantage of this change in charge may also be used.

With regard to a sensing scheme that utilizes the induced voltage of digit line 115-*a*, additional factors may negatively affect the sensing operation—e.g., reduce the sensing window. As discussed above, a sensing window may be defined as the difference between the voltages that result on digit line 115-*a* based at least in part on the initial state stored by ferroelectric capacitor 205. Factors such as ferroelectric memory cell characteristics, environmental characteristics, digit line characteristics, reference voltage errors, parasitic effects, and the like, may reduce the sensing window associated with a memory cell 105-*a*.

By way of example, applying an external voltage to plate line 210 may induce a voltage on digit line 115-*a* due to parasitic elements inherent in a memory device. This induced voltage may effectively reduce the amount of charged that is shared with, or released to, the digit line 115-*a* by ferroelectric capacitor 205 for both logic states. Accordingly, the resulting voltages for different logic states may be decreased, along with the difference between the resulting voltages. This decrease in the difference between the resulting voltages may thus decrease the sensing window. So a sensing scheme that maintains digit line 115-*a* at or near a ground reference while a voltage is applied to plate line 210 may be utilized to mitigate sense margin loss (i.e., decrease in the sense window) by increasing the amount of charge that is released onto digit line 115-*a* after selecting memory cell 105-*a*.

To write memory cell 105-*a*, a voltage may be applied across capacitor 205. Various methods may be used. In one example, selection component 220 may be activated through word line 110-*a* in order to electrically connect capacitor 205 to digit line 115-*a*. A voltage may be applied across capacitor 205 by controlling the voltage of cell plate 230 using plate line 210 and controlling the voltage of cell bottom 215 using digit line 115-*a*. To write a logic "0," cell plate 230 may be taken high, that is, a positive voltage may be applied to plate line 210, and cell bottom 215 may be taken low—e.g., virtually grounded using digit line 115-*a*. The opposite process is performed to write a logic "1", i.e., cell plate 230 may be taken low and cell bottom 215 may be taken high. Read and write operations of capacitor 205 may account for the non-linear properties associated with a ferroelectric device.

Figure 3:
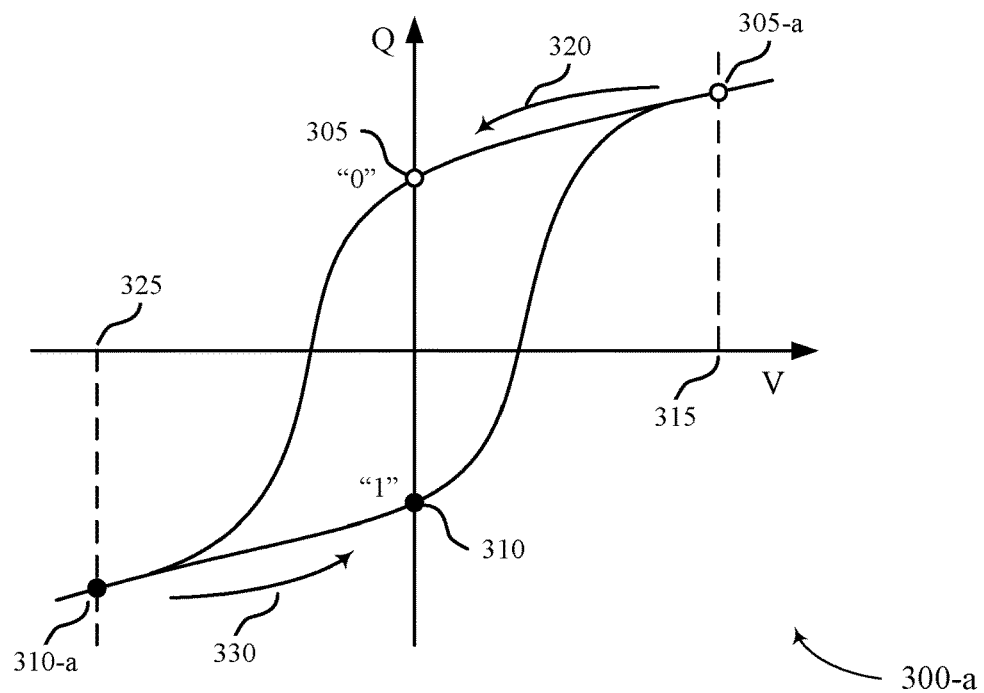
FIG. 3 illustrates example hysteresis plots for operating a ferroelectric memory cell in accordance with various embodiments of the present disclosure.
Figure 3:
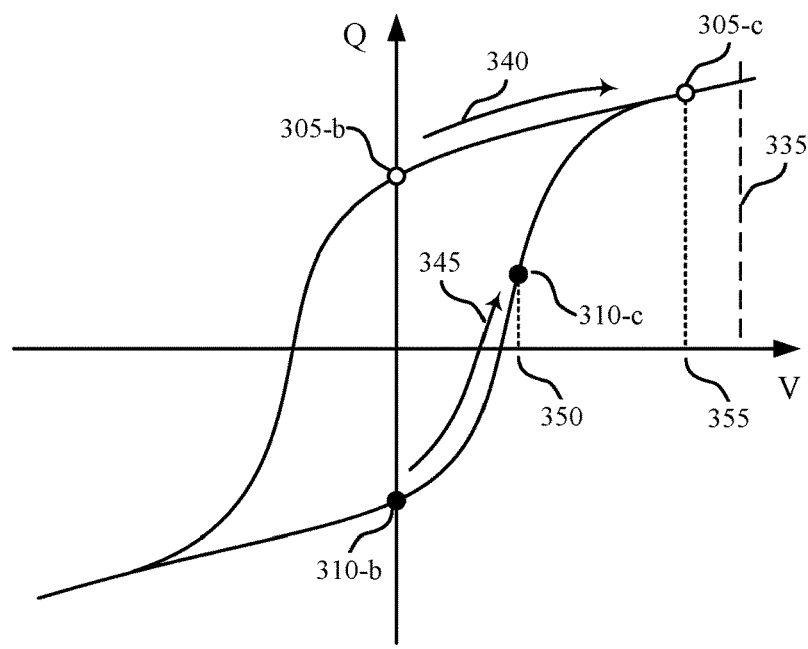

FIG. 3 illustrates examples of such non-linear properties with hysteresis curves 300-*a* (FIG. 3A) and 300-*b* (FIG. 3B) for a memory cell that supports a sensing scheme for a ferroelectric memory cell in accordance with various embodiments of the present disclosure. Hysteresis curves 300-*a* and 300-*b* illustrate an example ferroelectric memory cell writing and reading process, respectively. Hysteresis curves 300 depict the charge, Q, stored on a ferroelectric capacitor (e.g., capacitor 205 of FIG. 2) as a function of a voltage, V.

A ferroelectric material is characterized by a spontaneous electric polarization, i.e., it maintains a non-zero electric polarization in the absence of an electric field. Example ferroelectric materials include barium titanate ($BaTiO_3$), lead titanate ($PbTiO_3$), lead zirconium titanate (PZT), and strontium bismuth tantalate (SBT). The ferroelectric capacitors described herein may include these or other ferroelectric materials. Electric polarization within a ferroelectric capacitor results in a net charge at the ferroelectric material's surface and attracts opposite charge through the capacitor terminals. Thus, charge is stored at the interface of the ferroelectric material and the capacitor terminals. Because the electric polarization may be maintained in the absence of an externally applied electric field for relatively long times, even indefinitely, charge leakage may be significantly decreased as compared with, for example, capacitors employed in DRAM arrays. This may reduce the need to perform refresh operations as described above for some DRAM architectures.

Hysteresis curves 300 may be understood from the perspective of a single terminal of a capacitor. By way of example, if the ferroelectric material has a negative polarization, positive charge will accumulate at the terminal. Likewise, if the ferroelectric material has a positive polarization, negative charge will accumulate at the terminal. Additionally, it should be understood that the voltages in hysteresis curves 300 represent a voltage difference across the capacitor and are directional. For example, a positive voltage may be applied by applying a positive voltage to the terminal in question and maintaining the second terminal at ground. A negative voltage may be applied by maintaining the terminal in question at ground and applying a positive voltage to the second terminal—i.e., positive voltages may be applied to negatively polarize the terminal in question. Similarly, two positive voltages, two negative voltages, or any combination of positive and negative voltages may be applied to the appropriate capacitor terminals to generate the voltage difference shown in hysteresis curves 300.

As depicted in hysteresis curve 300-*a*, the ferroelectric material may maintain a positive or negative polarization with a zero voltage difference, resulting in two possible charged states: charge state 305 and charge state 310. According to the example of FIG. 3, charge state 305 represents a logic "0" and charge state 310 represents a logic "1." In some examples, the logic values of the respective charge states may be reversed to accommodate other schemes for operating a memory cell.

A logic "0" or "1" may be written to the memory cell by controlling the electric polarization of the ferroelectric material, and thus the charge on the capacitor terminals, by applying voltage. For example, applying a net positive voltage 315 across the capacitor results in charge accumulation until charge state 305-$a$ is reached. Upon removing voltage 315, charge state 305-$a$ follows path 320 until it reaches charge state 305 at zero voltage potential. Similarly, charge state 310 is written by applying a net negative voltage 325, which results in charge state 310-$a$. After removing negative voltage 325, charge state 310-$a$ follows path 330 until it reaches charge state 310 at zero voltage.

To read, or sense, the stored state of the ferroelectric capacitor, a voltage may be applied across the capacitor. In response, the stored charge changes, and the degree of the change depends on the initial charge state—i.e., the degree to which the stored charge of the capacitor changes varies depending on whether charge state 305-$b$ or 310-$b$ was initially stored. For example, hysteresis curve 300-$b$ illustrates two possible stored charge states 305-$b$ and 310-$b$. Net voltage 335 may be applied to the cell plate (e.g., cell plate 230 with reference to FIG. 2) of the capacitor. Although depicted as a positive voltage, voltage 335 may be negative. In response to voltage 335, charge state 305-$b$ may follow path 340. Likewise, if charge state 310-$b$ was initially stored, then it follows path 345. The final position of charge state 305-$c$ and charge state 310-$c$ depend on a number of factors, including the specific sensing operation and circuitry.

In some cases, the final charge may depend on the intrinsic capacitance of the digit line of a memory cell. For example, if the capacitor is electrically connected to the digit line and voltage 335 is applied, the voltage of the digit line may rise due to its intrinsic capacitance, and the voltage measured at a sense component may depend on the resulting voltage of the digit line. The position of final charge states 305-$c$ and 310-$c$ on hysteresis curve 300-$b$ may thus depend on the capacitance of the digit line and may be determined through a load-line analysis—i.e., charge states 305-$c$ and 310-$c$ may be defined with respect to the digit line capacitance. As a result, the voltage of the capacitor, voltage 350 or voltage 355, may be different and may depend on the initial state of the capacitor.

By comparing the difference of the voltage applied to the cell plate (e.g., voltage 335) and the voltage across the capacitor (e.g., voltage 350 or voltage 355) to a reference voltage, the initial state of the capacitor may be determined. As can be understood by reference to FIG. 2, the voltage of the digit line may be represented as the difference of the voltage applied to plate line 210 and the resulting voltage across the capacitor 205. As discussed above, the voltage of the digit line is based at least in part on the change in charge stored at the capacitor, and the change in charge is associated with the magnitude of the voltage that is applied across the capacitor. In some examples, the reference voltage may be an average of the digit line voltages that result from voltages 350 and 355 and, upon comparison, the sensed digit line voltage may be determined to be higher or lower than the reference voltage. A value of the ferroelectric cell (i.e., a logic "0" or "1") may then be determined based on the comparison.

A digit line that has an induced voltage as a result of parasitic effects may reduce the magnitude of the voltage that is applied across the capacitor, and therefore, decrease the resulting voltages 350 and 355. As can be seen from hysteresis curves 300-$a$ and 300-$b$, a decrease in the applied voltage may not yield proportional decreases in voltages 350 and 355, and the sensing window—e.g., the difference between the digit line voltages that result from voltages 350 and 355, respectively—may also be decreased. Therefore, a sensing scheme that maintains a digit line at or near a ground reference while a voltage is applied to a plate of the capacitor may be utilized to mitigate sense margin loss by increasing the voltage 335 that is applied across the capacitor and the amount of charge that is shared with the digit line.

As discussed above, reading a memory cell that does not use a ferroelectric capacitor may degrade or destroy the stored logic state. A ferroelectric memory cell, however, may maintain the initial logic state after a read operation. For example, if charge state 305-$b$ is stored and the read operation performed, the charge state may follow path 340 to charge state 305-$c$, and after removing voltage 335, the charge state may return to initial charge state 305-$b$, for example, by following path 340 in the opposite direction.

Figure 4:
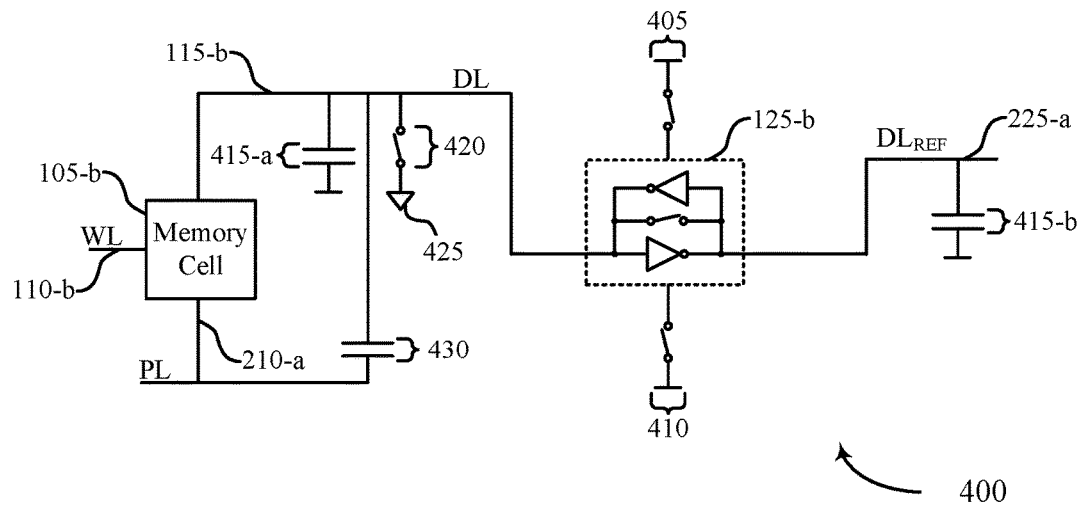
FIG. 4 illustrates an example circuit that supports a sensing scheme for a ferroelectric memory cell in accordance with various embodiments of the present disclosure.

FIG. 4 illustrates an example circuit 400 that supports a sensing scheme for a ferroelectric memory cell in accordance with various embodiments of the present disclosure. Circuit 400 includes ferroelectric memory cell 105-$b$, word line 110-$b$ (which may also be referred to as access line 110-$b$), digit line 115-$b$, and sense component 125-$b$, which may be examples of a ferroelectric memory cell 105, word line 110, digit line 115, and sense component 125, respectively, as described with reference to FIGS. 1 and 2. Circuit 400 may also include plate line 210-$a$ and reference line 225-$a$, which may be examples of plate line 210 and reference line 225, respectively, as described with reference to FIG. 2. Additionally, according to the example of FIG. 4, digit line 115-$b$ and reference line 225-$a$ include intrinsic capacitance 415-$a$ and intrinsic capacitance 415-$b$, respectively. Circuit 400 also includes voltage source 405, voltage source 410, switching component 420, and virtual ground 425, parasitic capacitance 430.

Digit line 115-$b$ and reference line 225-$a$ may have respective intrinsic capacitances 415-$a$ and 415-$b$, respectively. Intrinsic capacitances 415-$a$ and 415-$b$ may not be electrical devices—i.e., may not be two-terminal capacitors. Instead, intrinsic capacitances 415-$a$ and 415-$b$ may depend on physical characteristics, including the dimensions, of digit line 115-$b$ and reference line 225-$a$. In some cases, reference line 225-$a$ is implemented as an unused or inactive digit line of a memory array. Digit line 115-$b$ may be connected to virtual ground 425 via switching component 420. Virtual ground 425 may act as a common reference for circuit 400 and may also be referred to as ground or associated with a zero voltage, although, the virtual ground may float to a voltage that is different than (e.g., greater or less than) zero volts when referenced to an earth ground.

The voltage of reference line 225-$a$ may be input to sense component 125-$b$ as a reference for comparison against the voltage of digit line 115-$b$. A voltage may be applied to reference line 225-$a$ to provide the reference for comparing with the voltage of digit line 115-$b$. As depicted, ferroelectric memory cell 105-$b$ is in electronic communication with digit line 115-$b$. Ferroelectric memory cell 105-$b$ may include a selection component in electronic communication with a ferroelectric capacitor via word line 110-$b$, as described with reference to FIG. 2. The selection component may be activated by applying a voltage to word line 110-$b$ and may be used to provide a conductive path between the ferroelectric capacitor and the digit line 115-$b$. In one example, ferroelectric memory cell 105-$b$ may be selected, using the selection component, for a read operation to determine a state stored by the ferroelectric capacitor.

Plate line 210-a may also be in electronic communication with the ferroelectric capacitor. In some cases, a voltage may be applied to bias a plate of the ferroelectric capacitor via plate line 210-a (e.g., for a read operation). As mentioned above, applying the voltage to the plate line 210-a may induce parasitic voltages in other circuit locations. For instance, plate line 210-a may be capacitively coupled with digit line 115-b via parasitic capacitance 430, and a change in the voltage applied to plate line 210-a may also induce a change in the voltage applied to digit line 115-b. In some cases, plate line 210-a may be coupled with digit line 115-b via other parasitic elements (e.g., inductance, resistance, etc.). These parasitic effects may reduce a resulting sensing window used to determine the state stored by the ferroelectric capacitor. Applying the voltage to plate line 210-a in combination with applying a voltage to word line 110-b may result in the ferroelectric capacitor charging digit line 115-b. That is, upon accessing ferroelectric memory cell 105-b, the ferroelectric capacitor may share charge with digit line 115-b via intrinsic capacitance 415-a.

According to the example of FIG. 4, switching component 420 is in electronic communication with digit line 115-b and a ground reference. In some cases, switching component 420 may be used to connect or isolate digit line 115-b to or from a virtual ground reference. In one example, a control signal (e.g., a linear equalization signal) may be used to activate or deactivate switching component 420 by increasing or decreasing a linear equalization voltage applied to the switching component, respectively. In some cases, switching component 420 may be used to prevent the voltage of digit line 115-b from floating while digit line 115-b is not being used. Switching component 420 may also be used to combat the parasitic effects associated with applying a voltage to plate line 210-a. For instance, switching component 420 may be maintained in an active state while the voltage is applied to plate line to dampen a parasitic voltage induced on digit line 115-b and to drive the voltage of digit line 115-b to or near virtual ground 425, as will be described in more detail below.

In some examples, switching component 420 is referred to as a linear equalization device. Switching component 420 may be implemented as a transistor (e.g., an n or p-type FET) and may be activated/deactivated by applying increasing or reducing a control signal, or an amplified version of the control signal, to a gate of the transistor. In some cases, a voltage may be applied to plate line 210-a, word line 110-a, reference line 225-a, voltage source 405, or voltage source 410 via external/internal voltage source(s), amplifier(s), or line driver(s).

Sense component 125-b may be used to determine the stored state of ferroelectric memory cell 105-b. In some cases, sense component 125-b is or includes a sense amplifier. Sense component 125-b may be operated by voltage source 405 and voltage source 410. In some examples, voltage source 405 is a positive supply voltage, while voltage source 410 is a negative supply voltage or a virtual ground. Sense component 125-b may be used to determine a logic value of the ferroelectric memory cell 105-b based at least in part on the voltage of digit line 115-b and the voltage of the reference line 225-a. Sense component 125-b may be activated or deactivated by a controller. In some examples, sense component 125-b is activated or "fired" to trigger a comparison between the voltage of digit line 115-b and the voltage of reference line 225-a. Triggering sense component 125-b may include activating switching components that are in electronic communication with respective voltage sources 405 and 410 and sense component 125-b.

Sense component 125-b may latch the output of a sense amplifier to the voltage provided by either voltage source 405 or voltage source 410. For instance, if the voltage of the digit line 115-b is greater than the voltage of the reference line 225-a, then sense component 125-b may latch the output of the sense amplifier at a positive voltage supplied from voltage source 405. Reducing the parasitic effects on digit line 115-b may increase the sensing window for sensing operations, mitigating margin losses and increasing the reliability for reading memory cell 105-b.

Figure 5:
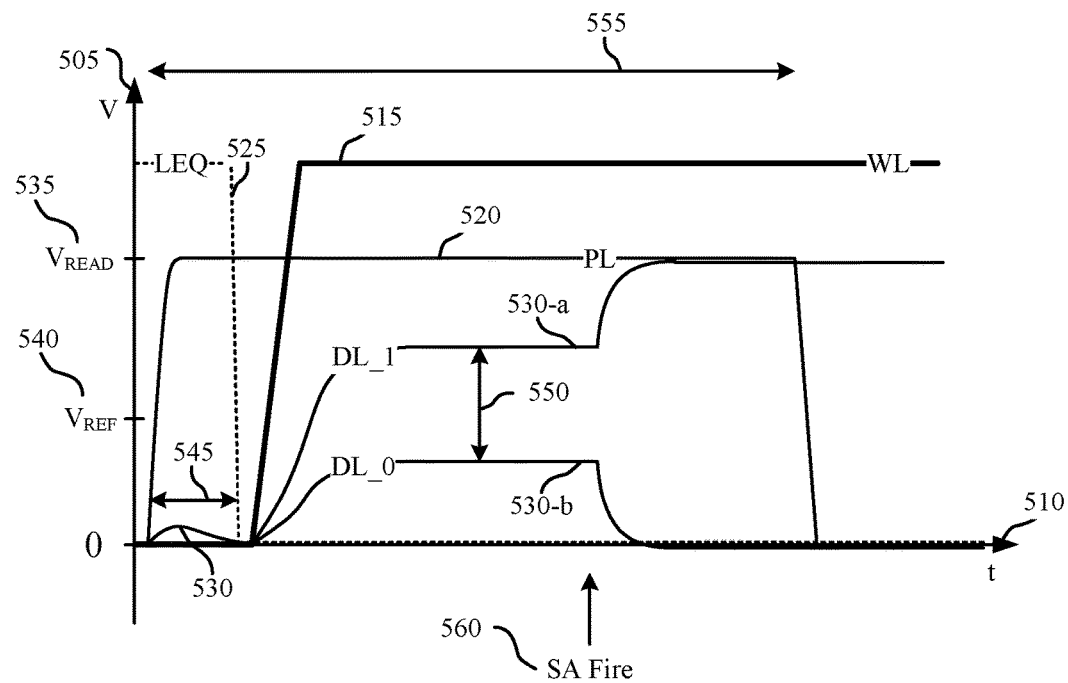
FIG. 5 illustrates a timing diagram for a sensing scheme for a ferroelectric memory cell in accordance with various embodiments of the present disclosure.

FIG. 5 illustrates a timing diagram 500 for a sensing scheme for a ferroelectric memory cell in accordance with various embodiments of the present disclosure. Timing diagram 500 depicts voltage on axis 505 and time on axis 510. The voltage of various components as a function of time may thus be represented on timing diagram 500. For example, timing diagram 500 includes word line voltage 515, plate line voltage 520, and digit line voltages 530-a and 530-b. Timing diagram 500 may also include read voltage 535, reference voltage 540, duration 545, sensing window 550, active duration 555, and firing time 560. Timing diagram 500 depicts an example operation of circuit 400 described with reference to FIG. 4. FIG. 5 is described below with reference to components of preceding figures. Voltages that approach zero may be offset from axis 510 for ease of representation; in some cases, these voltages may be equal to or approximately equal to zero.

As discussed with reference to FIG. 4, a voltage may be applied to switching component 420 to virtually ground digit line 115-b. In the example depicted in FIG. 5, a subsequent voltage may be applied to plate line 210-a. A read voltage—i.e., the voltage used to read the state of a ferroelectric capacitor—may be applied to plate line 210-a, biasing the ferroelectric capacitor. The plate line voltage 520, which may be measured at the plate of the ferroelectric capacitor, may increase with the applied read voltage. The change in plate line voltage 520 may cause a change in the digit line voltage 530 due, in part, to the parasitic elements of the digit line. As discussed above, this increase in the digit line voltage 530 may decrease the amount of charged shared with digit line 115-b from the ferroelectric capacitor and, in turn, may decrease sensing window 550—e.g., the difference between digit line voltage 530-a and 530-b. Therefore, the linear equalization voltage 525 may be applied and maintained at switching component 420 while applying the voltage to plate line 210-a. By maintaining switching component 420 in an active state, the resulting parasitic voltage on digit line 115-b may be dampened, and the digit line voltage 530 may be held near and/or driven towards zero volts or virtual ground.

In some cases, switching component 420 may be maintained in an active state until a threshold associated with applying the voltage is reached. For instance, switching component 420 may remain active until a determination has been made that the magnitude of the voltage of plate line 210-a is greater than a threshold voltage, the rate of change of the voltage of the plate line 210-a is less than or within a threshold value, or both. Additionally or alternatively, the threshold may be associated with a duration (e.g., duration 545) following the application of plate line voltage 520 or the satisfying of a voltage threshold. In some cases, the duration may be determined based at least in part on the size of the resulting sensing window 550, a characteristic of the ferroelectric capacitor (e.g., age, a corresponding hysteresis curve), environmental factors (e.g., temperature), a characteristic of the digit line (trace width, trace length, etc.), or any combination thereof. In some examples, an increased duration may be associated with an increased sensing window 550. Therefore, in one example, duration 545 may be increased for older ferroelectric memory arrays with ferroelectric capacitors that may be experiencing degraded hysteresis characteristics.

In some examples, duration 545 may be shortened or lengthened to accommodate different parasitic effects. For instance, duration 545 may be set long enough to remove some or all of the parasitic voltage from digit line 115-b (e.g., when digit line voltage 530 is less than 0.5 millivolts (mV)). In some cases, a duration 545 associated with removing a parasitic voltage or an increased sensing window 550, or both, may be determined using a mathematical model that has been developed for a ferroelectric memory array or based on established testing results. In other cases, duration 545 may be determined based on a timing associated with a reading or writing to ferroelectric memory cell 105-b. For instance, active duration 555 may be associated with a timing for reading ferroelectric memory cell 105-b and may include the time between raising and lowering the plate voltage. In some examples, duration 545 may be shortened to reduce active duration 555 and to accommodate a timing used by a memory device to complete a read operation. In some examples, duration 545 may be less than or equal to three nanoseconds (3 ns).

After a threshold has been reached—e.g., a voltage threshold has been reached, duration 545 has expired, or the like—linear equalization voltage 525 may be reduced (e.g., ramped down or dropped to 0V) to deactivate switching component 420. In some cases, linear equalization voltage 525 is reduced while plate line voltage 520 is increased. After deactivating switching component 420, digit line 115-b may be isolated from the virtual ground reference. Subsequently, a word line voltage 515 may be applied at word line 110-b to access ferroelectric memory cell 105-b. The word line voltage 515, which may be measured at the gate of a selection component, may increase with the applied access voltage. In some cases, word line voltage 515 may increase while linear equalization voltage 525 decreases. As the word line voltage 515 increases, a conductive path between the charged ferroelectric capacitor and digit line 115-b may be provided through the selection component. Accordingly, the digit line voltage 530 may rise as the ferroelectric capacitor discharges onto digit line 115-b.

In the example depicted in FIG. 5, the digit line voltage 530 may rise to one of two voltages based on the stored state. Although, as discussed above, these two voltages may vary based at least in part on the residual parasitic effects on digit line 115-b. For instance, if a logic "1" is stored by the ferroelectric capacitor, then digit line voltage 530-a may result, while digit line voltage 530-b may result if a logic "0" is stored. Digit line voltage 530-a may be associated with a smaller voltage drop over the ferroelectric cell and therefore a higher digit line voltage when compared with digit line voltage 530-b, as can be seen with respect to FIG. 3. The sensing window 550 between digit line voltage 530-a and digit line voltage 530-b may change based on the size of duration 545. In some examples, a longer duration 545 is associated with an increased sensing window 550 while a shorter duration 545 is associated with a decreased sensing window 550. As mentioned above, the determined duration 545 may be selected based on a number of factors.

After digit line voltage 530-a or 530-b has settled, sense component 125-b may be activated at firing time 560. The sense component 125-b may compare the digit line voltage 530 with the reference voltage 540 and the output of the sense component 125-b may be latched, accordingly. For instance, if a logic value "1" is stored by the ferroelectric capacitor, then the sense component 125-b may compare digit line voltage 530-a with reference voltage 540 and may determine the digit line voltage 530-a is higher than the reference voltage 540. Therefore, the output of the sense component 125-b may be driven to a positive supply voltage and latched. In the example depicted in FIG. 5, when the sense component 125-b outputs the positive supply voltage, digit line 115-b is also driven to the supply voltage.

Figure 6:
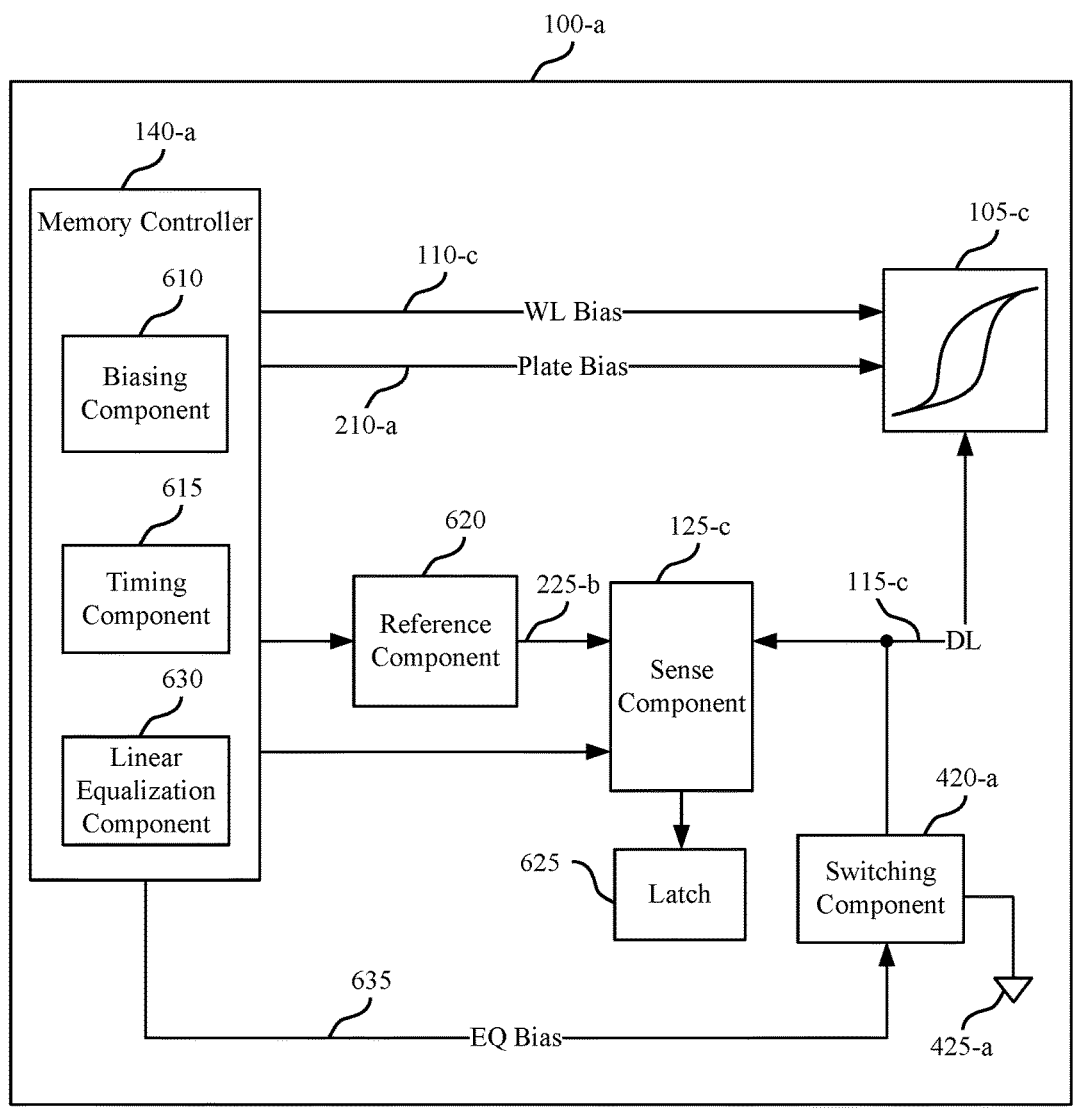
FIG. 6 illustrates an example ferroelectric memory array that supports a sensing scheme for a ferroelectric memory cell in accordance with various embodiments of the present disclosure.

FIG. 6 illustrates a block diagram 600 of an example ferroelectric memory array 100-a that supports a sensing scheme for a ferroelectric memory cell in accordance with various embodiments of the present disclosure. Memory array 100-a may contain memory controller 140-a, memory cell 105-c, and virtual ground 425-a, which may be examples of memory controller 140, memory cell 105, and virtual ground 425 described with reference to FIG. 1, 2, or 4.

Memory controller 140-a may include biasing component 610, timing component 615, and linear equalization component 630 and may operate memory array 100-a as described in FIGS. 1-5. Memory controller 140-a may be in electronic communication with word line 110-c, digit line 115-c, sense component 125-c, and plate line 210-a, and switching component 420-a, which may be examples of word line 110, digit line 115, sense component 125, plate line 210, and switching component 420 described with reference to FIG. 1, 2, or 4.

Memory array 100-a may also include reference component 620, latch 625, equalization line 635, and virtual ground 425-a. The components of memory array 100-a may be in electronic communication with one another and may perform the functions described with reference to FIGS. 1-5. In some cases, reference component 620, sense component 125-c, switching component 420-a, and latch 625 are components of memory controller 140-a.

In some examples, digit line 115-c is in electronic communication with switching component 420-a, sense component 125-c, and a ferroelectric capacitor of ferroelectric memory cell 105-c. Word line 110-c may be in electronic communication with memory controller 140-a and a selection component of memory cell 105-c. Plate line 210-a may be in electronic communication with memory controller 140-a and a plate of a ferroelectric capacitor of ferroelectric memory cell 105-c. Sense component 125-c may be in electronic communication with memory controller 140-a, reference line 225-b, digit line 115-c, and latch 625. Reference component 620 may be in electronic communication with memory controller 140-a and reference line 225-b. Switching component 420-a may be in electronic communication with memory controller 140-a, digit line 115-c, and virtual ground 425-a. These components may also be in electronic communication with other components, both inside and outside of memory array 100-a, not listed above, via other components, connections, or busses.

Memory controller 140-a may be configured to activate word line 110-c, plate line 210-a, digit line 115-c, or equalization line 635 by applying voltages to those various nodes. For example, biasing component 610 may be configured to apply a voltage to operate memory cell 105-c to read or write memory cell 105-c as described above. In some cases, memory controller 140-a may include a row decoder, column decoder, or both, as described with reference to FIG. 1. This may enable memory controller 140-a to access one or more memory cells 105. Biasing component 610 may also provide voltage potentials to reference component 620 in order to generate a reference signal for sense component 125-c. Additionally, biasing component 610 may provide signals or apply voltages for the operation of sense component 125-c.

In some cases, memory controller 140-a may perform its operations using timing component 615. For example, timing component 615 may control the timing of the various word line selections or plate biasing, including timing for switching and voltage application to perform the memory functions, such as reading and writing, discussed herein. In some cases, timing component 615 may control the operations of biasing component 610.

Reference component 620 may include various components to generate a reference signal for sense component 125-c. Reference component 620 may include circuitry specifically configured to produce a reference signal. In some cases, reference component 620 includes another ferroelectric memory cell 105. In some examples, reference component 620 may be configured to output a voltage with a value between the two sense voltages, as described with reference to FIG. 3. Or reference component 620 may be designed to output a virtual ground voltage (i.e., approximately 0V). Sense component 125-c may compare a signal from memory cell 105-c (through digit line 115-c) with a reference signal from reference component 620. Upon determining the logic state, sense component 125-c may then store the output in latch 625, where it may be used in accordance with the operations of an electronic device using the memory device of which memory array 100-a is a part.

In some cases, memory controller 140-a may use equalization line 635 to virtually ground digit line 115-c while a voltage is applied to plate line 210-a. For example, switching component 420-a may be used to virtually ground digit line 115-c with virtual ground 425-a; biasing component 610 may be used to apply a voltage to a plate of the ferroelectric capacitor via plate line 210-a while digit line 115-c is virtually grounded; and switching component 420-a may be used to isolate digit line 115-c from virtual ground 425-a after applying the voltage to the plate of the ferroelectric capacitor and after a threshold associated with applying the voltage is reached.

In some examples, memory controller 140-a may use biasing component 610 to activate and deactivate switching component 420-a via equalization line 635. In some cases, memory controller 140-a may use linear equalization component 630, which may be in electronic communication with switching component 420-a. Linear equalization component 630 may use biasing component 610 to adjust a linear equalization voltage applied to equalization line 635, which, in some cases, may activate switching component 420-a and virtually ground digit line 115-c.

In some cases, memory controller 140-a may use biasing component 610 to activate a selection component that is in electronic communication with the ferroelectric capacitor for a sense operation of ferroelectric memory cell 105-c and may determine a timing of the sense operation based at least in part on the applied linear equalization voltage. In some cases, memory controller 140-a activates the selection component by using biasing component 610 to apply a voltage to a word line 110-c. Memory controller 140-a may use timing component 615 to determine a duration between applying the voltage to the ferroelectric capacitor and isolating the digit line.

Figure 7:
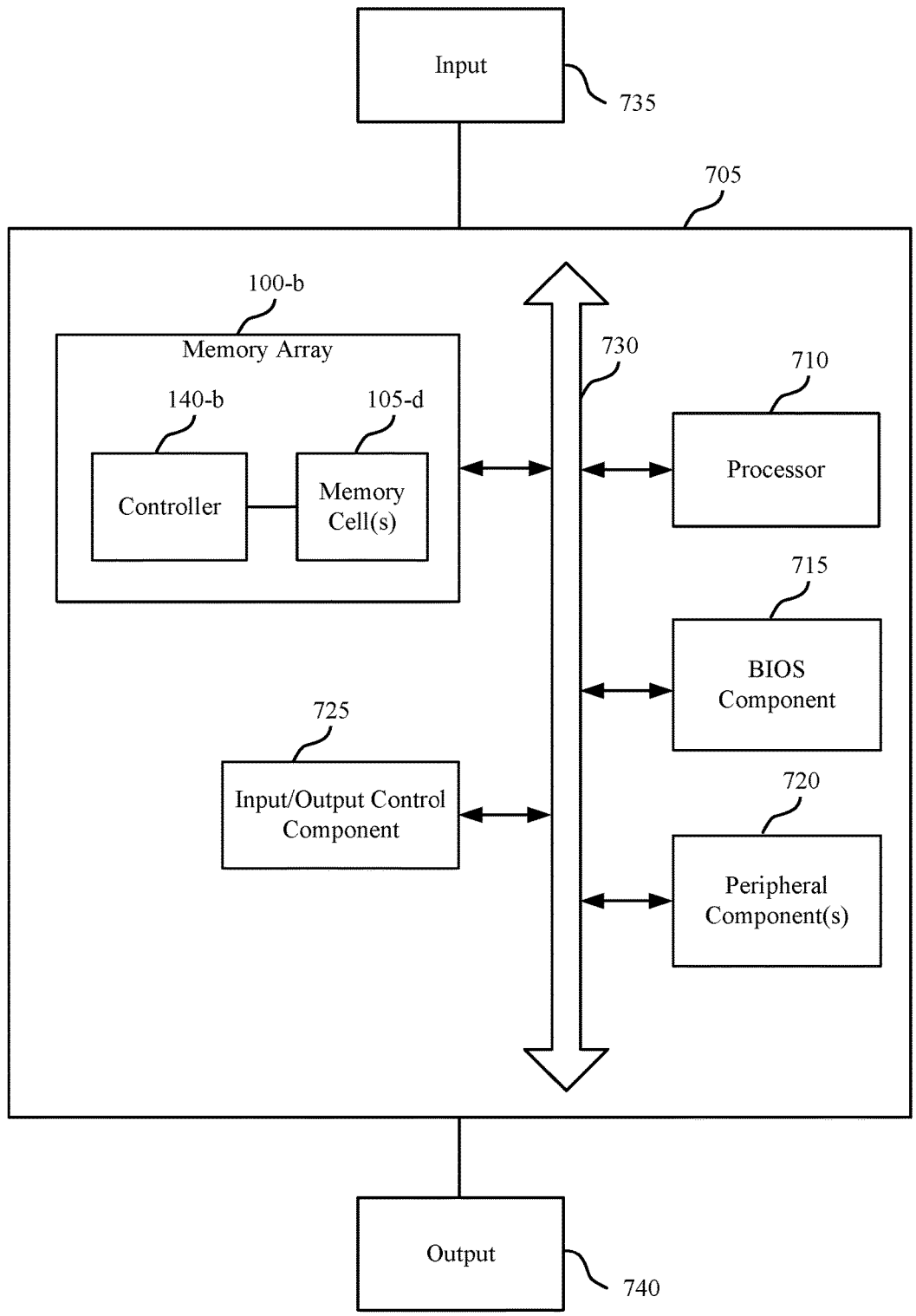
FIG. 7 illustrates a device, including a memory array, that supports a sensing scheme for a ferroelectric memory cell in accordance with various embodiments of the present disclosure.

FIG. 7 illustrates a system 700 that supports a sensing scheme for a ferroelectric memory cell in accordance with various embodiments of the present disclosure. System 700 includes a device 705, which may be or include a printed circuit board to connect or physically support various components. Device 705 includes a memory array 100-b, which may be an example of memory array 100 described with reference to FIG. 1 and FIG. 6. Memory array 100-b may contain memory controller 140-b and memory cell(s) 105-d, which may be examples of memory controller 140 described with reference to FIGS. 1 and 6 and memory cells 105 described with reference to FIG. 1-6. Device 705 may also include a processor 710, BIOS component 715, peripheral component(s) 720, and input/output control component 725. The components of device 705 may be in electronic communication with one another through bus 730.

Processor 710 may be configured to operate memory array 100-a through memory controller 140-b. In some cases, processor 710 may perform the functions of memory controller 140 described with reference to FIGS. 1 and 6. In other cases, memory controller 140-b may be integrated into processor 710. Processor 710 may be a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components, and processor 710 may perform various functions described herein, including supporting a sensing scheme for a memory cell. Processor 710 may, for example, be configured to execute computer-readable instructions stored in memory array 100-a to cause device 705 perform various functions or tasks.

BIOS component 715 may be a software component that includes a basic input/output system (BIOS) operated as firmware, which may initialize and run various hardware components of system 700. BIOS component 715 may also manage data flow between processor 710 and the various components, such as peripheral components 720, input/output control component 725, etc. BIOS component 715 may include a program or software stored in read-only memory (ROM), flash memory, or any other non-volatile memory.

Peripheral component(s) 720 may be any input or output device, or an interface for such devices, that is integrated into device 705. Examples may include disk controllers, sound controller, graphics controller, Ethernet controller, modem, USB controller, a serial or parallel port, or peripheral card slots, such as peripheral component interconnect (PCI) or accelerated graphics port (AGP) slots.

Input/output control component 725 may manage data communication between processor 710 and peripheral component(s) 720, input devices 735, or output devices 740. Input/output control component 725 may also manage peripherals not integrated into device 705. In some cases, input/output control component 725 may represent a physical connection or port to the external peripheral.

Input 735 may represent a device or signal external to device 705 that provides input to device 705 or its components. This may include a user interface or interface with or between other devices. In some cases, input 735 may be a peripheral that interfaces with device 705 via peripheral component(s) 720 or may be managed by input/output control component 725.

Output device 740 may represent a device or signal external to device 705 configured to receive output from device 705 or any of its components. Examples of output device 740 may include a display, audio speakers, a printing device, another processor or printed circuit board, etc. In some cases, output 740 may be a peripheral that interfaces with device 705 via peripheral component(s) 720 or may be managed by input/output control component 725.

The components of memory controller 140-b, device 705, and memory array 100-b may be made up of circuitry designed to carry out their functions. This may include various circuit elements, for example, conductive lines, transistors, capacitors, inductors, resistors, amplifiers, or other active or inactive elements, configured to carry out the functions described herein.

Figure 8:
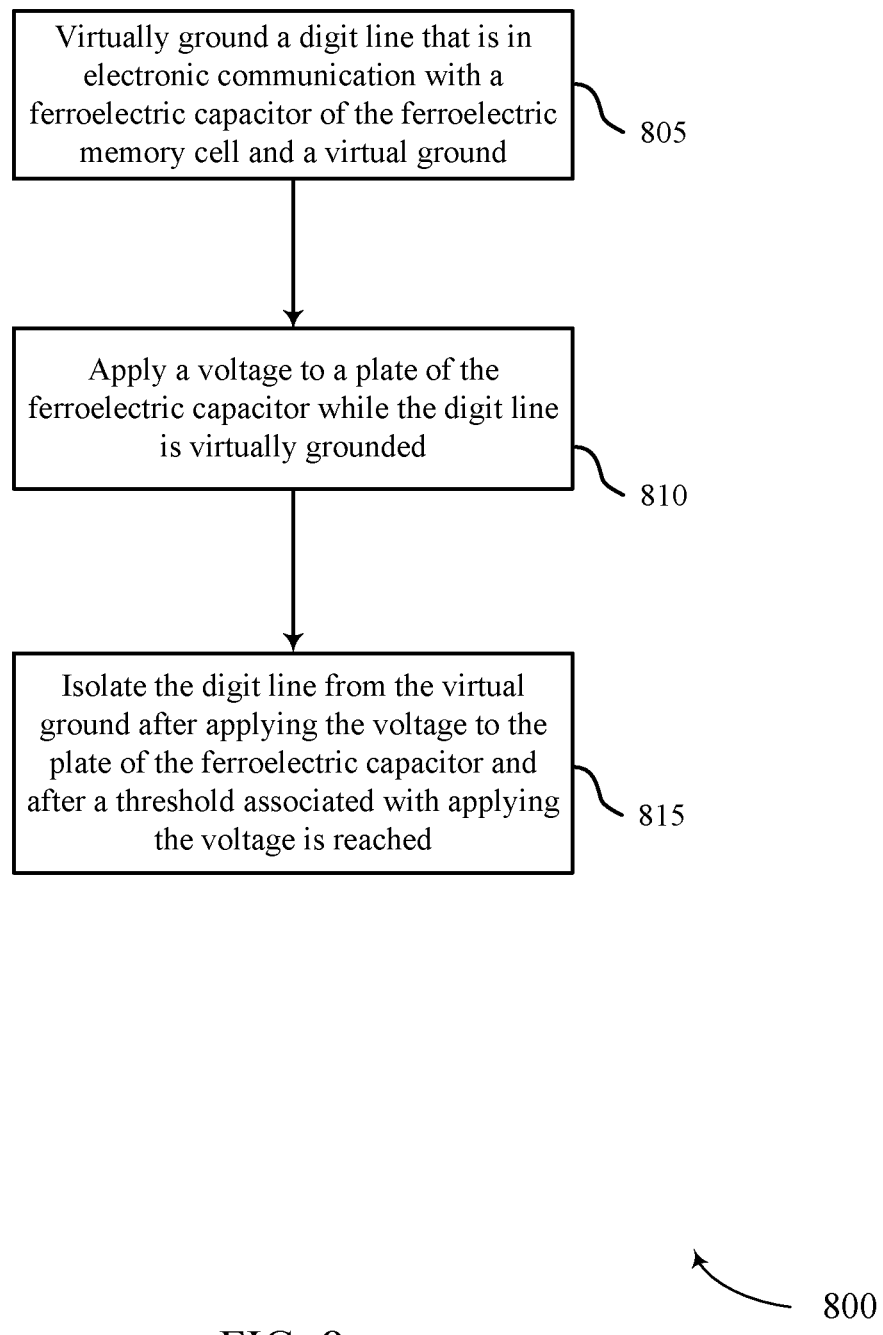
FIGS. 8 and 9 are flowcharts that illustrate a method or methods for a sensing scheme for a ferroelectric memory cell in accordance with various embodiments of the present disclosure.

FIG. 8 is a flowchart that illustrates a method 800 or methods for a sensing scheme for a ferroelectric memory cell in accordance with various embodiments of the present disclosure. The operations of method 800 may be implemented by a memory array 100, as described with reference to FIGS. 1-7. For example, the operations of method 800 may be performed by a memory controller 140, as described with reference to FIGS. 1, 6, and 7. In some examples, a memory controller 140 may execute a set of codes to control the functional elements of the memory array 100 to perform the functions described below. Additionally or alternatively, the memory controller 140 may perform features the functions described below using special-purpose hardware.

At block 805, the method 800 may include virtually grounding a digit line that is in electronic communication with a ferroelectric capacitor of the ferroelectric memory cell and a virtual ground. In certain examples, the operations of block 805 may be performed or facilitated by the switching component 420-a, as described with reference to FIG. 6. In some cases, virtually grounding the digit line may include activating a switching component that is in electronic communication with the digit line and the virtual ground. Activating the switching component may include applying a linear equalization voltage to the switching component.

At block 810, the method 800 may include applying a voltage to a plate of the ferroelectric capacitor while the digit line is virtually grounded. In certain examples, the operations of block 810 may be performed or facilitated by the biasing component 610, as described with reference to FIG. 6. Applying the voltage to the plate of the ferroelectric capacitor may include ramping a voltage applied to the plate of the ferroelectric capacitor. In one example, the voltage applied to the plate of the ferroelectric capacitor is ramped from zero volts to a fraction of a source voltage for an array, where the ferroelectric memory cell may be a portion of the array. In some cases, the voltage applied to the plate is increased while the linear equalization voltage is reduced.

At block 815, the method 800 may include isolating the digit line from the virtual ground after applying the voltage to the plate of the ferroelectric capacitor and after a threshold associated with applying the voltage is reached. In certain examples, the operations of block 815 may be performed or facilitated by the switching component 420-a, as described with reference to FIG. 6. In some cases, isolating the digit line from the virtual ground may include deactivating the switching component. Deactivating the switching component may include reducing a linear equalization voltage applied to the switching component that is in electronic communication with the digit line and the virtual ground.

In some cases, the method 800 may include determining the threshold has been reached, wherein the threshold is associated with at least one of a magnitude of a voltage of the plate or a rate of change of the voltage of the plate, or both. The threshold may be associated with a duration following the voltage application to the plate of the ferroelectric capacitor, and the duration may be determined based at least in part on a timing associated with reading or writing to the ferroelectric memory cell or a removing a parasitic voltage from the digit line, or both. For instance, the duration may be less than or equal to 3 ns. In some examples, the method 800 may include activating a selection component that is in electronic communication with the ferroelectric capacitor for a sense operation of the ferroelectric memory cell after the linear equalization voltage is reduced. Activating the selection component may include applying a voltage to a word line in electronic communication with the ferroelectric memory cell. In some cases, the voltage applied to the word line is increased while the linear equalization voltage is reduced.

Figure 9:
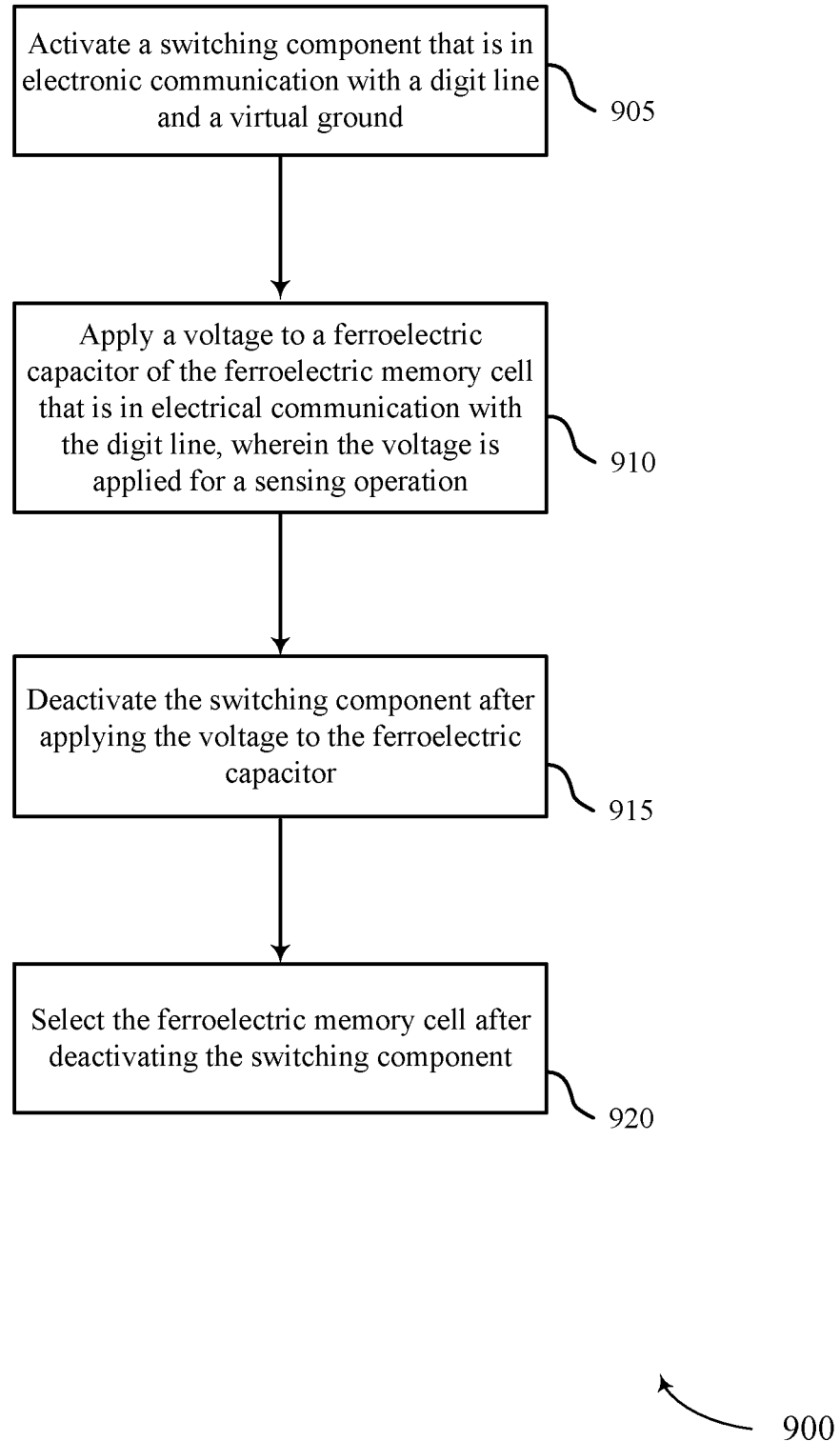

FIG. 9 is a flowchart that illustrates a method 900 or methods for a sensing scheme for a ferroelectric memory cell in accordance with various embodiments of the present disclosure. The operations of method 900 may be implemented by a memory array 100, as described with reference to FIGS. 1-7. For example, the operations of method 900 may be performed by a memory controller 140, as described with reference to FIGS. 1, 6, and 7. In some examples, a memory controller 140 may execute a set of codes to control the functional elements of the memory array 100 to perform the functions described below. Additionally or alternatively, the memory controller 140 may perform features the functions described below using special-purpose hardware.

At block 905, the method 900 may include activating a switching component that is in electronic communication with a digit line and a virtual ground. In certain examples, the operations of block 905 may be performed or facilitated by the biasing component 610, as described with reference to FIG. 6. Activating the switching component may include applying a voltage to the switching component.

At block 910, the method 900 may include applying a voltage to a ferroelectric capacitor of the ferroelectric memory cell that is in electrical communication with the digit line, wherein the voltage is applied for a sensing operation. In certain examples, the operations of block 910 may be performed or facilitated by the biasing component 610, as described with reference to FIG. 6.

At block 915, the method 900 may include deactivating the switching component after applying the voltage to the ferroelectric capacitor. In certain examples, the operations of block 915 may be performed or facilitated by the biasing component 610 and/or timing component 615, as described with reference to FIG. 6. Deactivating the switching component may include removing the voltage. In some cases, the switching component is deactivated based at least in part on determining a magnitude of a voltage of a plate of the ferroelectric capacitor has reached a first threshold or determining a rate of change for the voltage of the plate is within a second threshold, or both. In some cases, the method 900 may include determining a duration between applying the voltage to the ferroelectric capacitor and deactivating the switching component. The duration may be determined based at least in part on: a characteristic of the ferroelectric memory cell, a characteristic of the digit line, a timing associated with reading or writing to the ferroelectric memory cell; a full dump window size, where the full dump window size may be determined based at least in part on a measured difference between a voltage of the digit line resulting from a first state stored by the ferroelectric capacitor and a voltage of the digit line resulting from a second stored state stored by the ferroelectric capacitor, or any combination thereof.

At block 920, the method 900 may include selecting the ferroelectric memory cell after deactivating the switching component. In certain examples, the operations of block 915 may be performed or facilitated by the biasing component 610 and/or timing component 615, as described with reference to FIG. 6. Selecting the ferroelectric memory cell may include applying a voltage to a selection component that is in electronic communication with the ferroelectric capacitor and the digit line.

Thus, methods 800 and 900 may provide for a sensing scheme for a memory cell for a ferroelectric memory array. Methods 800 and 900 may each be methods of operating a ferroelectric memory cell. It should be noted that methods 800 and 900 describe possible implementations, and the operations and steps may be rearranged or otherwise modified such that other implementations are possible. In some examples, features from two or more of the methods 800 and 900 may be combined.

The description herein provides examples, and is not limiting of the scope, applicability, or examples set forth in the claims. Changes may be made in the function and arrangement of elements discussed without departing from the scope of the disclosure. Various examples may omit, substitute, or add various procedures or components as appropriate. Also, features described with respect to some examples may be combined in other examples.

The description set forth herein, in connection with the appended drawings, describes example configurations and does not represent all the examples that may be implemented or that are within the scope of the claims. The terms "example" and "exemplary," as used herein, mean "serving as an example, instance, embodiment, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. When the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly connected with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The term "electronic communication" refers to a relationship between components that supports electron flow between the components. This may include a direct connection between components or may include intermediate components. Components in electronic communication may be actively exchanging electrons or signals (e.g., in an energized circuit) or may not be actively exchanging electrons or signals (e.g., in a de-energized circuit) but may be configured and operable to exchange electrons or signals upon a circuit being energized. By way of example, two components physically connected via a switch (e.g., a transistor) are in electronic communication regardless of the state of the switch (i.e., open or closed).

The term "isolated" refers to a relationship between components in which electrons are not presently capable of flowing between them; components are isolated from each other if there is an open circuit between them. For example, two components physically connected by a switch may be isolated from each other when the switch is open.

The devices discussed herein, including memory array 100, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A transistor or transistors discussed herein may represent a field-effect transistor (FET) and comprise a three terminal device including a source, drain, and gate. The terminals may be connected to other electronic elements through conductive materials (e.g., metals). The source and drain may be conductive and may comprise a heavily-doped (e.g., degenerate), semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The various illustrative blocks, components, and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C).

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor.

Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not to be limited to the examples and designs described herein but is to be accorded the broadest scope consistent with the principles and novel features disclosed herein.

What is claimed is:

1. A method, comprising:
   virtually grounding a digit line that is in electronic communication with a ferroelectric capacitor of a ferroelectric memory cell and a virtual ground;
   applying a voltage to a plate of the ferroelectric capacitor until a threshold associated with applying the voltage is reached based at least in part on virtually grounding the digit line and before sensing a logic state of the ferroelectric memory cell as part of a read operation; and
   isolating the digit line from the virtual ground after applying the voltage to the plate of the ferroelectric capacitor.

2. The method of claim 1, further comprising:
   determining that the threshold has been reached based at least in part on a magnitude of the voltage applied to the plate.

3. The method of claim 1, wherein virtually grounding the digit line comprises:
   activating a switching component that is in electronic communication with the digit line and the virtual ground, and wherein isolating the digit line from the virtual ground comprises:
   deactivating the switching component.

4. The method of claim 3, wherein deactivating the switching component comprises:
   reducing a linear equalization voltage applied to the switching component.

5. The method of claim 3, further comprising:
   activating a selection component that is in electronic communication with the ferroelectric capacitor for a sense operation of the ferroelectric memory cell after activating the switching component.

6. The method of claim 5, wherein activating the selection component comprises:
   applying a voltage to a word line in electronic communication with the ferroelectric memory cell.

7. The method of claim 4, wherein the threshold is associated with a duration following the application of the voltage to the plate of the ferroelectric capacitor.

8. The method of claim 7, wherein the duration is determined based at least in part on a timing associated with an access operation of the ferroelectric memory cell, or a removing a parasitic voltage from the digit line, or both.

9. The method of claim 1, wherein applying the voltage to the plate of the ferroelectric capacitor comprises ramping the voltage applied to the plate of the ferroelectric capacitor.

10. A method, comprising:
    virtually grounding a digit line that is in electronic communication with a ferroelectric capacitor of a ferroelectric memory cell and a virtual ground;
    applying a first voltage to a plate of the ferroelectric capacitor while the digit line is virtually grounded;
    reducing a second voltage applied to a switching component that is in electronic communication with the digit line and the virtual ground based at least in part on applying the first voltage; and
    applying a third voltage to a word line in electronic communication with the ferroelectric memory cell, wherein the third voltage applied to the word line increases while the second voltage is reduced.

11. The method of claim 10, further comprising:
    isolating the digit line from the virtual ground after applying the first voltage to the plate of the ferroelectric capacitor and after a threshold associated with applying the first voltage is reached based at least in part on reducing the second voltage.

12. The method of claim 11, wherein the threshold is associated with a duration following the application of the first voltage to the plate of the ferroelectric capacitor.

13. The method of claim 12, wherein the duration is determined based at least in part on a timing associated with reading or writing to the ferroelectric memory cell or a removing a voltage from the digit line, or both.

14. The method of claim 10, wherein applying the first voltage to the plate occurs before sensing a logic state of the ferroelectric memory cell as part of a read operation.

15. The method of claim 11, further comprising:
determining that the threshold has been reached, wherein the threshold is associated with at least one of a magnitude of a voltage of the plate, or a rate of change of the voltage of the plate, or both.

16. The method of claim 10, further comprising:
activating a selection component that is in electronic communication with the ferroelectric capacitor for a sense operation of the ferroelectric memory cell after the second voltage is reduced, wherein applying the third voltage to the word line is based at least in part on activating the selection component.

17. A method, comprising:
virtually grounding a digit line that is in electronic communication with a ferroelectric capacitor of a ferroelectric memory cell and a virtual ground;
applying a first voltage to a plate of the ferroelectric capacitor until a threshold associated with applying the first voltage is reached based at least in part on virtually grounding the digit line; and
reducing a second voltage applied to a switching component that is in electronic communication with the digit line and the virtual ground, wherein the first voltage applied to the plate is increased while the second voltage is reduced.

18. The method of claim 17, further comprising:
isolating the digit line from the virtual ground after applying the first voltage to the plate of the ferroelectric capacitor and after the threshold associated with applying the first voltage is reached based at least in part on reducing the second voltage.

19. The method of claim 17, wherein applying the first voltage to the plate occurs before sensing a logic state of the ferroelectric memory cell as part of a read operation.

20. The method of claim 17, wherein applying the first voltage to the plate of the ferroelectric capacitor comprises ramping a voltage applied to the plate of the ferroelectric capacitor.

* * * * *